US006667234B2

(12) United States Patent
Wu et al.

(10) Patent No.: US 6,667,234 B2
(45) Date of Patent: Dec. 23, 2003

(54) METHOD OF FABRICATING NODE CONTACTS

(75) Inventors: King-Lung Wu, Tainan Hsien (TW); Tzung-Han Lee, Taipei (TW); Kun-Chi Lin, Hsinchu (TW)

(73) Assignee: United Microelectronics Corp., Hinschu (TW)

( * ) Notice: Subject to any disclaimer, the term of this patent is extended or adjusted under 35 U.S.C. 154(b) by 369 days.

(21) Appl. No.: 09/789,358

(22) Filed: Feb. 20, 2001

(65) Prior Publication Data

US 2002/0115291 A1 Aug. 22, 2002

(51) Int. Cl.⁷ ............................................... H01L 21/44
(52) U.S. Cl. ..................... 438/675; 438/656; 438/657; 438/655; 438/596; 257/303; 257/306; 257/307; 257/311
(58) Field of Search ................................ 438/253, 396, 438/397, 595, 596, 655, 656, 657, 675; 257/296, 303, 306, 307, 311

(56) References Cited

U.S. PATENT DOCUMENTS 6,077,738 A * 6/2000 Lee et al. .................... 438/241
6,133,599 A * 10/2000 Sung et al. .................. 257/296
6,218,241 B1 * 4/2001 Chuang ....................... 438/253

* cited by examiner

Primary Examiner—David Nelms
Assistant Examiner—Renee' R Berry
(74) Attorney, Agent, or Firm—J.C. Patents

(57) ABSTRACT

A method of fabricating a node contact on a substrate, which contains a first conductive device and an insulating layer covering the substrate and the first conductive device, includes forming at least two conductive lines on the insulating layer, wherein the conductive lines are separated by a first distance; forming at least two second conductive devices on the insulating layer, wherein the second conductive devices are separated by a second distance, and wherein one of the conductive lines and one of the second conductive devices are separated by a third distance, and wherein both the first and second distances are greater than the third distance; forming an isolation layer of a thickness on the substrate to cover the insulating layer, the conductive lines and the second conductive devices, wherein the isolation layer comprises a dished area located between the second conductive devices; removing a portion of the isolation layer to form a spacer around the second conductive devices, and to deepen the dished area to form an opening exposing the insulating layer; deepening the opening to expose the first conductive device; and filling the opening with a conductive material.

18 Claims, 3 Drawing Sheets

METHOD OF FABRICATING NODE CONTACTS

BACKGROUND OF THE INVENTION

1. Field of Invention

The present invention relates to a method of fabricating semiconductor devices. More particularly, the present invention relates to a method of fabricating node contacts.

2. Description of Related Art

Dynamic random access memory is one of the most broadly used integrated circuit devices. Developing a dynamic random access memory with a higher storage capacity is always a demand accompanying the growth of industrial application. Within each memory cell of a dynamic random access memory, a node contact is employed for connecting a capacitor and a transistor. A conventional method for fabricating a node contact includes defining a dielectric layer above a substrate to form a node contact opening that exposes the substrate, and filling the node contact opening with conductive material. The node contact establishes electrical connection between metal lines and source/drain region in the substrate, and between the metal lines and the metal gate of the transistor.

FIGS. 1A through 1C show a conventional method of fabricating a node contact. In FIG. 1A, metal silicide line 106 is formed on a substrate 100, wherein the substrate 100 includes pre-formed conductive device 102 and a first insulating layer 104. Spacers 108 are then formed on the lateral sides of the metal silicide line 106. Next, a second insulating layer 110 is formed on the first insulating layer 104. A photoresist layer 112 is formed on the second insulating layer 110 and is then defined by using a node contact mask.

In FIG. 1B, an etching process is performed to form a contact opening 114 on the second insulating layer 112. As shown in FIG. 1C, another etching process is performed to remove a portion of the first insulating layer 104 to further deepen the contact opening 114 for forming the node contact opening by using the previously formed contact opening 114 as a etching mask, wherein the node contact opening 114 exposes the conductive device 102. Finally, conductive material 116 is filled into the node contact opening 114 to form a node contact.

However, in the conventional method, a node contact mask must be used to define the layout of node contacts, and two insulating layers are to be etched through for forming the desired node contact openings, a relatively long etching process is required. A long etching process and employing a node contact mask usually lead to problems such as misalignment. In addition, the complexity of the conventional method also increases the manufacturing cost.

SUMMARY OF THE INVENTION

Accordingly, one object of the present invention is to provide a method of fabricating a node contact to simplify the fabrication process and reduce manufacturing cost.

Another object of the invention is to provide a method of fabricating a node contact for preciously forming node contacts that are electrically connected to conductive devices formed underneath.

It is also an object of the invention to provide a method of fabricating a node contact which forms metal silicide lines and devices on a substrate containing conductive devices and a first insulating layer without additional manufacturing processes.

To achieve these and other advantages and in accordance with the purpose of the invention, as embodied and broadly described herein, the invention provides a method of fabricating a node contact that defines the layout of node contact during the step of forming metal silicide lines and devices. The spacers surrounding the metal silicide lines and devices are also used to construct the node contact openings. Hence, the fabrication process is simplified, and the manufacturing cost is reduced indeed.

The method of the invention forms metal silicide lines and devices on a substrate containing conductive devices and a first insulating layer with a layout that defines predetermined spaces between metal silicide lines and devices. A silicon nitride layer is then formed on the metal silicide lines and devices, wherein the thickness of the silicon nitride layer is greater than one half of the distance separating the silicide line and device. The upper profile of the substrate containing metal silicide lines and devices automatically forms trenches after the step of forming the silicon nitride layer, wherein those trenches are later to be further etched for forming node contact openings. An etching process is then performed to form spacers around the metal silicide lines and devices, wherein the spaces between the spacers are the desired node contact openings. A portion of the first insulating layer exposed by the node contact openings is removed by an etching process to expose the conductive devices and to further deepen the node contact openings. The node contact openings are then filled with conductive material to form node contacts. A second insulating layer is formed on the substrate and then defined to expose the node contacts. Finally, a capacitor is formed by a conventional method, wherein the capacitor is electrically coupled with the node contacts.

The most significant features of the invention include arranging the layout of metal silicide lines and devices, and forming a silicon nitride layer of a certain thickness. While arranging the layout, the distance separating two metal silicide devices is greater than that separating a metal silicide line and a metal silicide device. The thickness of silicon nitride layer is greater than one half of the distance separating a metal silicide line and a metal silicide device. The step of depositing silicon nitride layer forms pits or trenches, which are processed into node contact openings later. The method of the invention forms node contact openings at the same time when the spacers are formed without using a node contact mask, so the fabricating process is simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
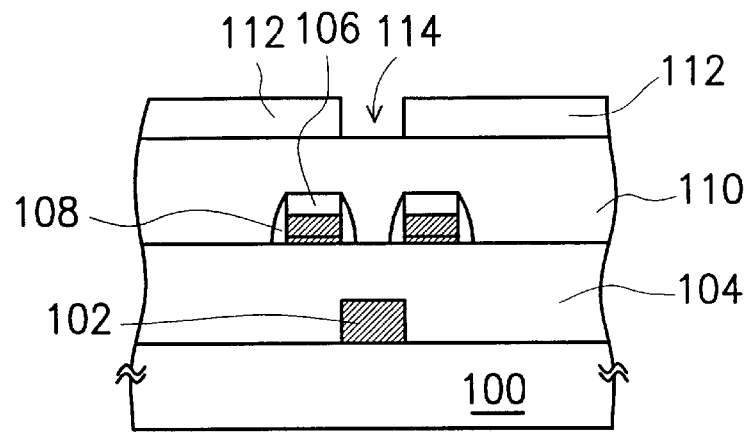
FIGS. 1A through 1C are schematic cross-sectional views of a conventional method of fabricating a node contact.
Figure 1B:
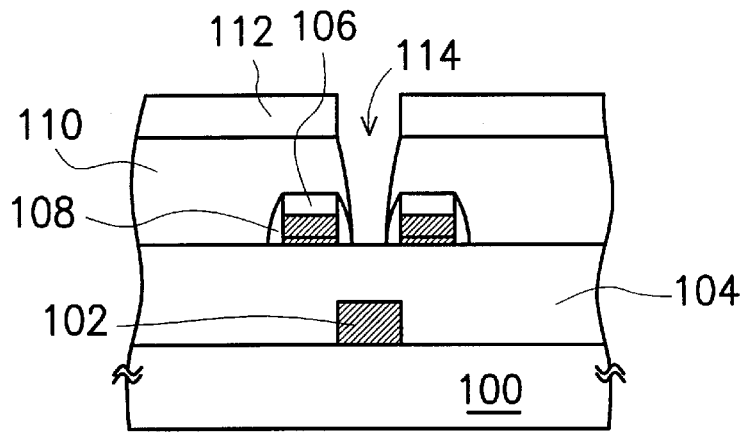
Figure 1C:
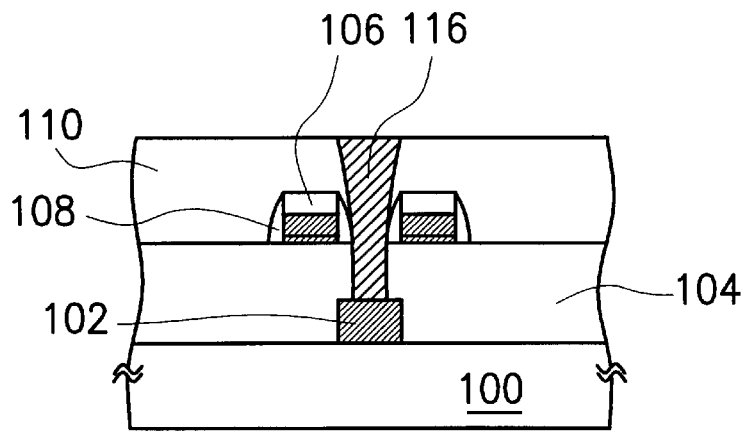

Reference will now be made in detail to the present preferred embodiments of the invention, examples of which are illustrated in the accompanying drawings. Wherever possible, the same reference numbers are used in the drawings and the description to refer to the same or like parts.

Figure 2A:
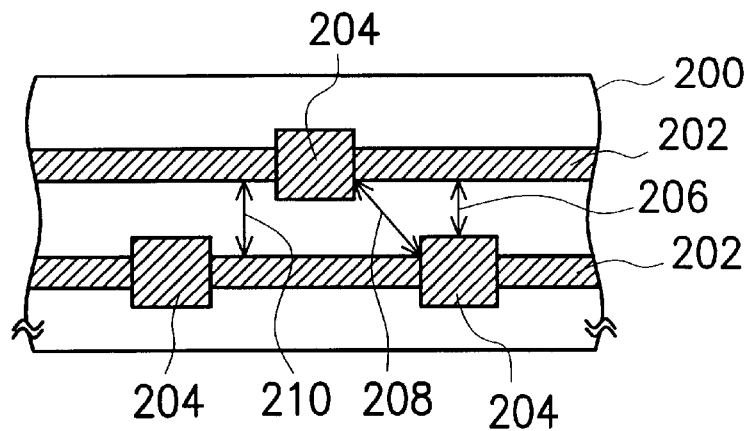
FIGS. 2A and 2B are schematic top views of a semiconductor substrate.

FIG. 2A is a schematic top view of a semiconductor substrate 200 containing a first conductive layer, such as a metal silicide, according to one preferred embodiment of the invention. In order to increase the integration of devices, a conventional layout containing parallel-arranged devices has been replaced with an layout interlace-arranged lines 202 and devices 204. In FIG. 2A, the metal silicide device 204 and the metal silicide line 202 are separated by a distance 206, two devices 204 are separated by a distance 208, and two metal silicide lines 202 are separated by a distance 210. The distances 208 and 210 are both greater than the distance 206.

Figure 2B:
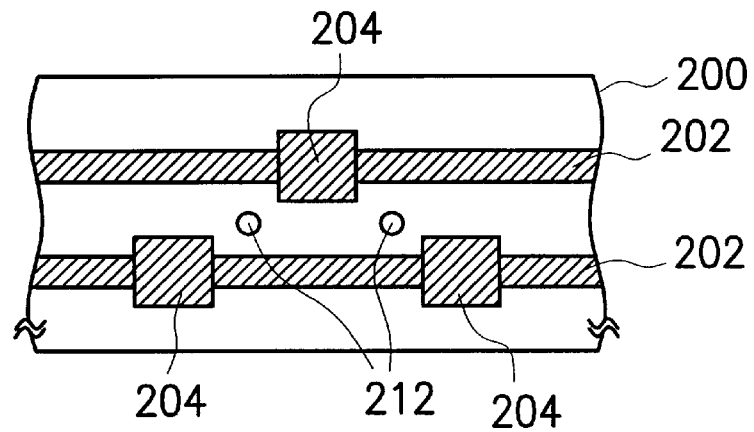

FIG. 2B is another schematic top view showing the semiconductor substrate 200, wherein the substrate 200 is covered by an isolation layer, such as silicon nitride layer, of a certain thickness. The thickness of the silicon nitride layer has to be greater than one half of the distance 206. Therefore, after the formation of the silicon nitride layer, the spaces between metal silicide devices 204 and lines 202 are filled up with silicon nitride. However, since the separation 208 between devices 204 and separation 210 between lines 202 are greater than the distance 206, the space between device 204 and line 202 cannot be totally filled up with silicon nitride. Hence, pits or trenches 212 are automatically formed after the formation of the silicon nitride layer. A schematic cross-section view of the semiconductor substrate 200 of FIG. 2B is shown in FIG. 2C.

Figure 2C:
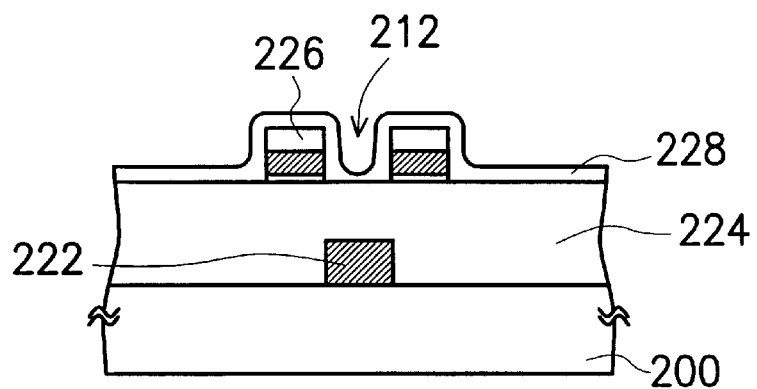
FIGS. 2C through 2F are schematic cross-sectional views of a method of fabricating a node contact according to a preferred embodiment of this invention.

In FIG. 2C, a conductive device 222 and a first insulating layer 224 are formed on the substrate 200 before the metal silicide lines (not shown) and devices 226 are formed thereon. A silicon nitride layer 228 is formed on the substrate 200 to cover the top profile of the substrate 200. The silicon nitride layer 228 can be formed by chemical vapor deposition, wherein the thickness of the silicon nitride layer 228 is greater than one half of the distance 206 between the device 204 and line 202 of FIG. 2A. Because the separation between devices 226 are greater than the separation between device and line, the space between devices 226 cannot be totally filled up with silicon nitride layer 228. Therefore, a pit or trench 212 is automatically formed. The pit 212 is then used to form node contact opening in the following process.

Figure 2D:
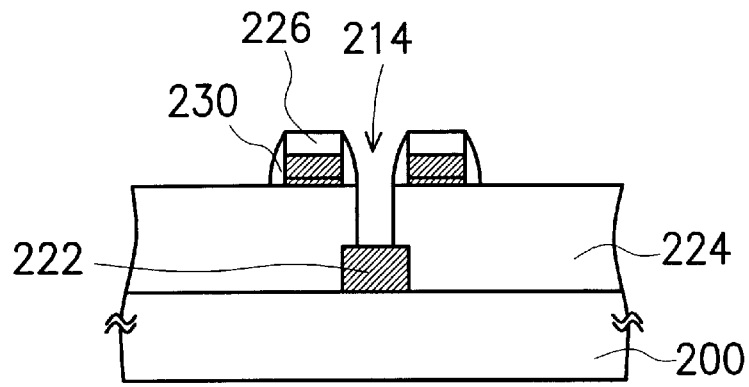

As referred to in FIG. 2D, a portion of the silicon nitride layer 228 is removed by performing an etching process, such as dry etching. Spacers 230 are formed around the devices 226. In the meantime, a node contact opening 214 which exposes the first insulating layer 224 is also formed between devices 226. Because the opening 214 and the spacers 230 are formed at the same time, an etching process can then be performed to remove a portion of the first insulating layer 224 to expose the underneath conductive device 222 without employing a conventional node contact mask. The method of removing the first insulating layer 224 can be a plasma etching process.

Figure 2E:
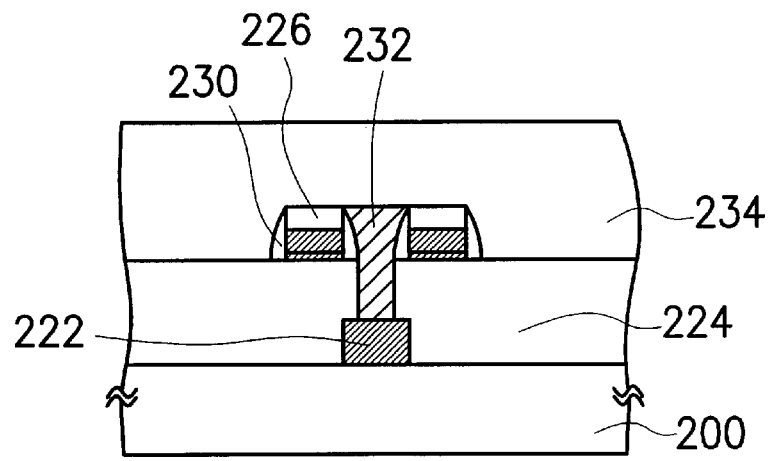

Next, as shown in FIG. 2E, the node contact opening 214 is filled up with conductive material to form a node contact 232, a conductive plug, wherein the conductive material includes polysilicon or the similar. The filling method of the conductive material 232 can be chemical vapor deposition. Afterward, a second insulating layer 234, such as silicon nitride of chemical vapor deposition, is formed on the first insulating layer 224 and the node contact 232.

Figure 2F:
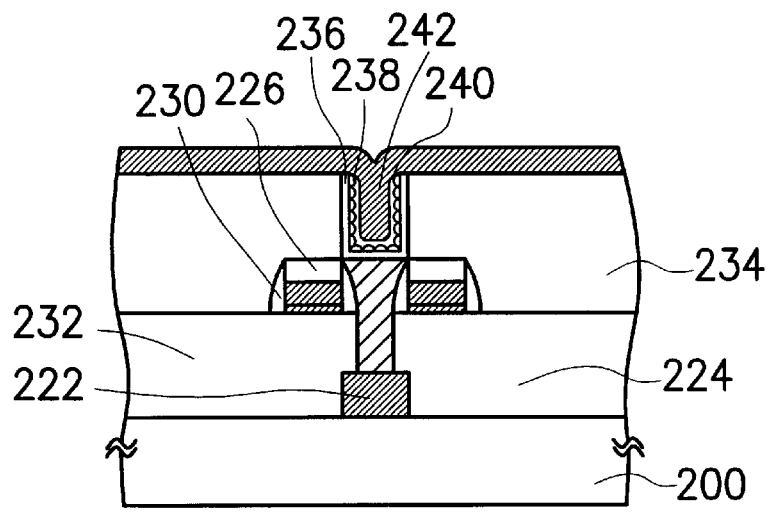

Referring to FIG. 2F, a portion of the second insulating layer 234 is removed to expose the top of the node contact 232. A conventional capacitor is then formed on the second insulating layer 234, wherein the bottom electrode 236 of the capacitor is electrically coupled with the node contact 232. The capacitor, from bottom to top, includes a bottom electrode 236 which can be polysilicon of chemical vapor deposition, a semispherical-grain silicon layer 238 formed on the bottom electrode 236 by chemical vapor deposition, a dielectric layer 240 made of ONO of chemical vapor deposition, and a upper electrode 242.

In summary, the most significant features of the invention include the layout of to metal silicide lines and devices as shown in FIG. 2A, and the thickness of silicon nitride layer 228 of FIG. 2C. While arranging the layout, the distance separating two metal silicide devices is greater than that separating a metal silicide line and a metal silicide device. The thickness of silicon nitride layer is greater than one half of the distance separating a metal silicide line and a metal silicide device. The step of depositing silicon nitride layer automatically forms pits or trenches without using a conventional node contact mask to further define the locations of node contacts. The trenches or pits are further deepened to form node contact openings by an etching process performed later on the first insulating layer. The method of the invention forms node contact openings at the same time when the spacers are formed without using a node contact mask, so the fabricating process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a node contact on a substrate, wherein the substrate comprises a first conductive device and an insulating layer covering the substrate and the first conductive device, the method comprising steps of:

forming at least two conductive lines on the insulating layer, wherein the conductive lines are separated by a first distance;

forming at least two second conductive devices on the insulating layer, wherein the second conductive devices are separated by a second distance, and wherein one of the conductive lines and one of the second conductive devices are separated by a third distance, and wherein both the first and second distances are greater than the third distance;

forming an isolation layer of a thickness on the substrate to cover the insulating layer, the conductive lines and the second conductive devices, wherein the isolation layer comprises a dished area which is located between the second conductive devices;

removing a portion of the isolation layer to form a spacer around the second conductive devices, and to deepen the dished area to form an opening exposing the insulating layer;

deepening the opening to expose the first conductive device; and filling the opening with a conductive material.

2. The method of claim 1, wherein the isolation layer includes silicon nitride.

3. The method of claim 2, wherein the step of forming an isolation layer includes chemical vapor deposition.

4. The method of claim 2, wherein the step of removing a portion of the isolation layer includes dry etching.

5. The method of claim 1, wherein the thickness is greater than one half of the third distance.

6. The method of claim 1, wherein the conductive material includes polysilicon.

7. The method of claim 6, wherein the step of filling the opening includes chemical vapor deposition.

8. The method of claim 1, wherein the conductive lines include metal silicide.

9. The method of claim 1, wherein the second conductive devices include metal silicide.

10. A method of fabricating a node contact on a substrate, wherein the substrate comprises a first conductive device and an insulating layer covering the substrate and the conductive device, the method comprising steps of:

forming a first conductive line and a second conductive line on the insulating layer, wherein the first and second conductive lines are separated by a first distance;

forming on the insulating layer, a second conductive device connected to the first conductive line and a third conductive device connected to the second conductive line, wherein the second and third conductive devices are separated by a second distance, and wherein the second conductive device and the second conductive line are separated by a third distance, and wherein the first and second distances are greater than the third distance;

forming an isolation layer of a thickness on the substrate to cover the first insulating layer, the first and second conductive lines, and the second and third conductive devices, wherein the isolation layer comprises a dished area between the second and third conductive devices;

removing a portion of the isolation layer to form a spacer around the second and third conductive devices, and to deepen the dished area to form an opening exposing the first insulating layer;

deepening the opening to expose the first conductive device; and filling the opening with a conductive material.

11. The method of claim 10, wherein the isolation layer includes silicon nitride.

12. The method of claim 11, wherein the step of forming an isolation layer includes chemical vapor deposition.

13. The method of claim 11, wherein the step of removing a portion of the isolation layer includes dry etching.

14. The method of claim 10, wherein the thickness is greater than one half of the third distance.

15. The method of claim 10, wherein the conductive material includes polysilicon.

16. The method of claim 15, wherein the step of filling the opening includes chemical vapor deposition.

17. The method of claim 10, wherein the first and second conductive lines include metal silicide.

18. The method of claim 10, wherein the second and third conductive devices include metal silicide.

* * * * *